United States Patent [19]

Altmann et al.

[11] Patent Number: 4,592,029

[45] Date of Patent: May 27, 1986

[54] ARRAY APPARATUS FOR READING-OUT A TWO-DIMENSIONAL CHARGE IMAGE

[75] Inventors: Franz Altmann, Munich; Bernd Granz, Oberasbach, both of Fed. Rep. of Germany; Dieter Grenda, Milnerton, South Africa; Ralph Oppelt, Herzogenaurach, Fed. Rep. of Germany

[73] Assignee: Siemens Aktiengesellschaft, Berlin and Munich, Fed. Rep. of Germany

[21] Appl. No.: 503,798

[22] Filed: Jun. 13, 1983

[30] Foreign Application Priority Data

Jun. 28, 1982 [DE] Fed. Rep. of Germany ....... 3224026

[51] Int. Cl.⁴ ............................................. G01S 15/89
[52] U.S. Cl. ...................................... 367/7; 250/578; 358/213; 367/105
[58] Field of Search ................. 367/7, 8, 11, 105, 122; 250/578; 358/212, 213

[56] References Cited

PUBLICATIONS

Fry, "Silicon Photodiode Arrays", *Journal of Physics E: Scientific Instruments*, vol. 8, 1975, pp. 337–349.
IEEE Ultrasonics Symposium, 1980, pp. 766 to 769.
"Integrated Acoustic Array and Acoustical Holography", vol. 7, Kessler (Ed.), Plenum Press, pp. 423 to 455.

*Primary Examiner*—Richard A. Farley
*Attorney, Agent, or Firm*—Kenyon & Kenyon

[57] ABSTRACT

An array device having a plurality of stacked circuit boards, each having a recess in a flat side thereof which extends parallel to a narrow side; the recess containing electronic components. Control lines for the electronic components are arranged on a flat side of the circuit board. Each circuit board has a narrow side which is provided with electrodes which are ordered as a matrix in rows and columns. The electrodes of the circuit boards are each associated with a respective switchable amplifier. The switchable amplifiers are arranged one behind the other in the longitudinal direction of a recess, and are connected by respective conductors having substantially equal lengths for coupling the switchable amplifiers to their respective electrodes. A plurality of main control lines are arranged on the narrow sides of the circuit boards for connecting the control lines of the switchable amplifiers in the same column to one another. Thus, the number of electrodes in each row can be increased without being required to be an integral multiple of the inputs of electronic modules.

16 Claims, 3 Drawing Figures

ARRAY APPARATUS FOR READING-OUT A TWO-DIMENSIONAL CHARGE IMAGE

BACKGROUND OF THE INVENTION

This invention relates generally to device for reading-out a two-dimensional charge image, and more particularly, to a device wherein such reading-out is achieved by means of an array which contains stacked circuit boards. One of the flat sides of each circuit board is provided with recesses which extend parallel to the narrow sides of the circuit boards, and which contain electronic components. The invention further relates to device wherein control lines for the electronic components are arranged on a flat side of the circuit board, and wherein one of the narrow sides of each circuit board is provided with electrodes; the electrodes of the circuit boards being ordered as a matrix in rows and columns.

Device for reading-out a two-dimensional ultrasonic image is known to be provided for an ultrasonic camera. Such known device contains a stack of several, illustratively sixteen, one-dimensional arrays. Each such array has several elementary converters and a multiplexer, and optionally also an amplifier and a filter. The electronic circuitry is arranged in a slot of a circuit board which is preferably a ceramic plate, and which forms this linear array. The depth of one of the one-dimensional arrays is illustratively 1.5 mm. The known apparatus is described in "IEEE Ultrasonics Symposium", 1980, pages 766 to 769.

In the known device, the connecting lines between the inputs of the multiplexer and the elementary converters of each one-dimensional array have different lengths. The number of elementary converters on the end face of one of the circuit boards is limited, as determined by the multiplexer inputs. The number of converters may be, for example, 16 or 32, or an integral multiple of these multiplexer inputs.

In a further known device for reading-out a two-dimensional ultrasonic image by means of an integrated acoustic array, a two-dimensional array is provided with a matrix of dual-gate MOS-FETs ordered in rows and columns. In known integrated circuit technology, for example, 8 dual-gate MOS-FETs in each row and in each column can be provided for a total of 64 such dual-gate MOS-FETs. The dual-gate MOS-FETs are known to persons skilled in the art as "MOS-FET tetrodes." Every element of the matrix consists of a gate leak resistor, an elementary converter, and a dual-gate MOS-FET, wherein the gate leak resistor and the elementary converter are electrically connected in parallel and to the first gate terminal of the dual-gate MOS-FET. The second gate of each dual-gate MOS-FET of each column is connected to an address line, and each drain terminal of the dual-gate MOS-FET of a row is connected to a read line. This arrangement is described in "Integrated Acoustic Array and Acoustical Holography", volume 7, Kessler (Editor), Plenum Press, pages 423 to 455.

In this known device, the currents in a line within the matrix can combine additively, such that in the case of a large matrix such added currents can produce an overload at the signal line, or also may lead to excessively large voltage drops along this line.

It is, therefore, an object of this invention to improve the known devices. More particularly, it is an object of this invention to select the number of electrodes of each row continuously and without being required to be an integral multiple of the inputs of electronic modules.

It is a further object of this invention to provide an arrangement wherein all connecting conductors from the elementary converters to the inputs of the corresponding switchable amplifiers are of at least approximately equal length.

SUMMARY OF THE INVENTION

The foregoing and other objects are achieved by this invention which provides a device for reading-out a two-dimensional charge image by means of an array. The array contains stacked circuit boards, each having one of their flat sides provided with a recess which extends parallel to the narrow sides of the circuit boards. Electronic components are arranged within the recesses of the circuit boards. The control lines for the electronic components are arranged on a flat side of each circuit board, and one of the narrow sides of each circuit board is provided with electrodes which are ordered as a matrix in rows and columns. In accordance with the invention, a switchable amplifier is provided and is associated with each of the electrodes of the circuit boards which are arranged one behind the other in the longitudinal direction of the recess. In addition, connecting conductors are provided between the electrodes and their corresponding switchable amplifiers; which connecting conductors are arranged to have approximately equal lengths. Main control lines are arranged on the narrow sides of the circuit boards opposite to the electrodes in the direction of the columns which connect the respective control lines of the switchable amplifiers of the circuit boards, of the same column, to each other.

Since a switchable amplifier is associated with each of the electrodes of the circuit boards, which are arranged one behind the other in the longitudinal direction of a recess, and since connecting conductors of at least approximately equal length are provided between the electrodes and the corresponding switchable amplifiers, the number of electrodes of each row can be selected continuously and without corresponding to integral multiples of inputs of electronic modules. Moreover, homogeneous signal amplification is obtained as a result of the equal lengths of the connecting conductors.

In accordance with a particularly advantageous further embodiment of the invention, the control lines are each connected to an electrically conducting surface area on the narrow sides of the circuit boards opposite to the electrodes, and the main control lines are arranged on the narrow sides of the circuit boards opposite the electrodes in the direction of the columns. The main control lines connect the control lines belonging to the same column of the switchable amplifiers of the circuit boards to each other. Since a circuit board always forms a row of the matrix, the boards can be replaced easily if individual circuit boards fail. This is possible particularly from the fact that the main control lines lying in the direction of the columns of the matrix are applied externally to the matrix.

In a preferred embodiment, dual-gate MOS-FETs are provided as switchable amplifiers. The electrodes of a circuit board are connected to the respective first gate of the associated dual-gate MOS-FET, and the second gate of the dual-gate MOS-FET of a circuit board is connected to a control line. In addition, the drain terminals of the dual-gate MOS-FETs of a circuit board are connected to a common signal line, and the ground lines of the circuit boards are connected to a ground bus outside of the circuit boards.

In a particularly advantageous embodiment of the invention, the matrix of the electrodes is provided with an ultrasound-sensitive layer, illustratively formed of a polymer foil which contains a powder of lead-zirconate-titanate PZT. More particularly, the polymer foil may be made of polyvinylidene fluoride PVDF, which is provided with an electrode. Thus, the device for reading-out a two-dimensional charge image becomes a particularly simple device for reading-out a two-dimensional ultrasonic image.

In a further embodiment of the invention, the recess can be configured as a slot. The matrix of the elements may also be provided with a light-sensitive layer, illustratively a layer of silicon which is connected to an electrode. In such an arrangement, the device for reading-out a two-dimensional charge image is simultaneously operable as a device for reading-out a two-dimensional light image.

BRIEF DESCRIPTION OF THE DRAWINGS

Comprehension of the invention is facilitated by reading the following detailed description in conjunction with the annexed drawings, in which.

DETAILED DESCRIPTION

Figure 1:
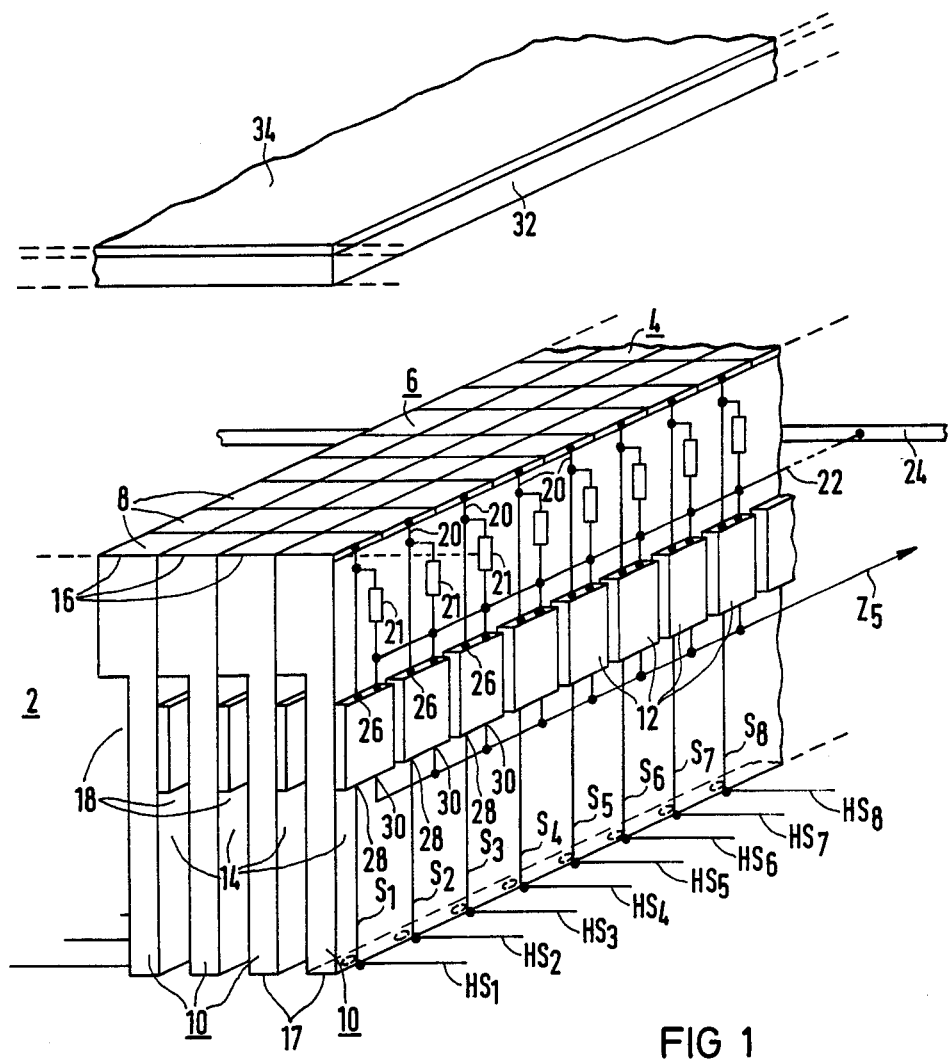
FIG. 1 is an isometric and schematic representation of a device which is suitable for ultrasonic scanning in accordance with the invention.

FIG. 1 is an isometric and schematic representation of a device for reading-out a two-dimensional charge image by means of an array 2 having a matrix of electrodes 8 arranged in rows 4 and columns 6. In this embodiment, a plurality of illustratively 200 stacked circuit boards 10 and dual-gate MOS-FETs 12 are also provided. One of the flat sides 14 of each circuit board 10 being provided with a recess 18 extending in a direction parallel with a narrow side 16. Moreover, one of narrow sides 16 of each circuit board 10 is provided with several electrodes 8. In this specific illustrative embodiment, 200 such electrodes 8 may be provided, the width of which corresponds to the width of the circuit board.

A dual-gate MOS-FET 12 is associated with each electrode 8 of the circuit board. These dual-gate MOS-FETs 12 are arranged one behind the other on flat side 14 of circuit board 10 facing away from recess 18. As shown in FIG. 1, dual-gate MOS-FETs 12 are covered by the recess 18 of an adjacent circuit board 10. Connecting conductors 20, each having approximately equal and relatively short lengths, are arranged between the electrodes 8 and the corresponding dual-gate MOS-FETs 12. Circuit boards 10 each contain a ground conductor 22, the ground conductors 22 being arranged parallel to narrow sides 16 and connected to each other only outside of circuit boards 10 by means of a ground bus 24. The cross-sectional configuration of ground bus 24 can be selected almost arbitrarily. Electrodes 8 of row 4 are each connected by means of one of connecting conductors 20 to a first gate 26 and a leak resistor 21 of an associated one of dual-gate MOS-FETs 12.

In a preferred embodiment, circuit board 10 is formed of a ceramic material, illustratively aluminum oxide $Al_2O_3$. A second gate 28 of dual-gate MOS-FET 12 is connected to one of a plurality of control lines designated $S_1$ to $S_8$. A plurality of main control lines $HS_1$ to $HS_8$ are arranged on narrow sides 17 of circuit boards 10 opposite electrodes 8 in the direction of columns 6. Main control lines $HS_1$ to $HS_8$ connect control lines $S_1$ to $S_8$ of dual-gate MOS-FETs 12 associated with individual ones of circuit boards 10, to one another in an electrically conducting manner. It is to be understood that the present invention contemplates use of more than 8 control lines and main control lines. Thus, although the invention contemplates within its scope n control lines and main control lines, such that main control lines $HS_1$ to $HS_n$ are provided for $S_1$ to $S_n$ control lines, only the first 8 main control lines $HS_1$ to $HS_8$ and the first 8 control lines $S_1$ to $S_8$, are shown in FIG. 1. Dual-gate MOS-FETs 12 are each provided with a drain terminal 30 for each circuit board 10, which drain terminals are connected to a respective signal output line, of which only one is shown in FIG. 1, and is designated as $Z_5$.

The upper flat side of the matrix of electrodes 8 is provided with an ultrasonic sensitive layer 32, illustratively a polymer foil which contains a powder of lead-zirconate-titanate PZT, and, as indicated hereinabove, may be a foil of polyvinylidene fluoride PVDF. The upper flat side of this ultrasonic-sensitive layer 32 is provided with an electrode 34 and is polorized in the direction of its thickness only in the regions which lie between the matrix of electrodes 8 and electrode 34. These regions, therefore, each form an elementary converter. Electrodes 8 and 34 consist of electrically conductive material, illustratively silver, which is applied to the narrow sides 16 of circuit boards 10, and ultrasonic-sensitive layer 32. Such application of silver may be achieved by any of several known methods, illustratively vapor deposition or sputtering. Ultrasonic-sensitive layer 32 may be constructed, for example, in strips, the width of which corresponds to the width of the narrow sides 16 of circuit boards 10, and may, in particular, be a foil of large area which covers the matrix of electrodes 8. In some embodiments, it may be useful if the matrix of the electrodes is provided with a light-sensitive layer, illustratively silicon, the upper side of which is provided with an electrode 34.

Circuit boards 10, together with their associated electrodes 8 and dual-gate MOS-FETs each form a module. By using hybrid techniques, array 2 can be constructed from a multiplicity of modules, illustratively 200 in number. Circuit boards 10, may be of a type which is customary in standard hybrid technology, illustratively formed of aluminum oxide $Al_2O_3$. Such circuit boards are suitable for thin-film technique and are useful in this arrangement as support material for electrodes 8 and dualgate MOS-FETs 12. Moreover, the circuit boards can preferably serve at the same time as backing for the elementary converters. It is a particular advantage of this modular design that one or more circuit boards 10 can easily be replaced if individual dual-gate MOS-FETs fail.

By using dual-gate MOS-FETs 12 which serve as switches, amplifiers, and impedance transformers for the elementary converters, a good separation between signal output lines and control lines is achieved because two gates 26 and 28 are provided. The gates substantially represent only capacitances to common ground line 22. Crosstalk from control lines $S_1$ to $S_8$ to connecting lines 20 is therefore practically impossible. In addition, the signals of each of the elementary converters are amplified and their impedance is transformed.

Since the capacitance of small elementary converters is always very small, connecting lines 20 between the elementary converters and the associated gate 26 of dual-gate MOS-FETs 12 of a circuit board 10 must be short in order to avoid losses. Moreover, all connecting lines are of equal length, and homogeneous signal amplification is thereby achieved.

Since the matrix of electrodes 8 is covered by an ultrasonic-sensitive layer 32, the upper flat side of which is provided with an electrode 34, a two-dimensional ultrasonic image can be read-out. Also, since a matrix with illustratively 200×200 elementary converters, and with a length of circuit boards 10 of, for example, 160 mm and a width of, for example, 0.8 mm, the space available for an elementary converter is in general small if an ultrasonic image of high resolution is scanned. Also, only very thin conductors can be used as current leads and for the signal lines. Thus, standard hybrid technology, and in particular, thin-film technique, is chosen as the form of construction. This also applies to ground line 22. In some embodiments, it may be advantageous to arrange dual-gate MOS-FETs 12 of one of the circuit boards one behind the other inside recess 18 of the circuit board.

Figure 2:
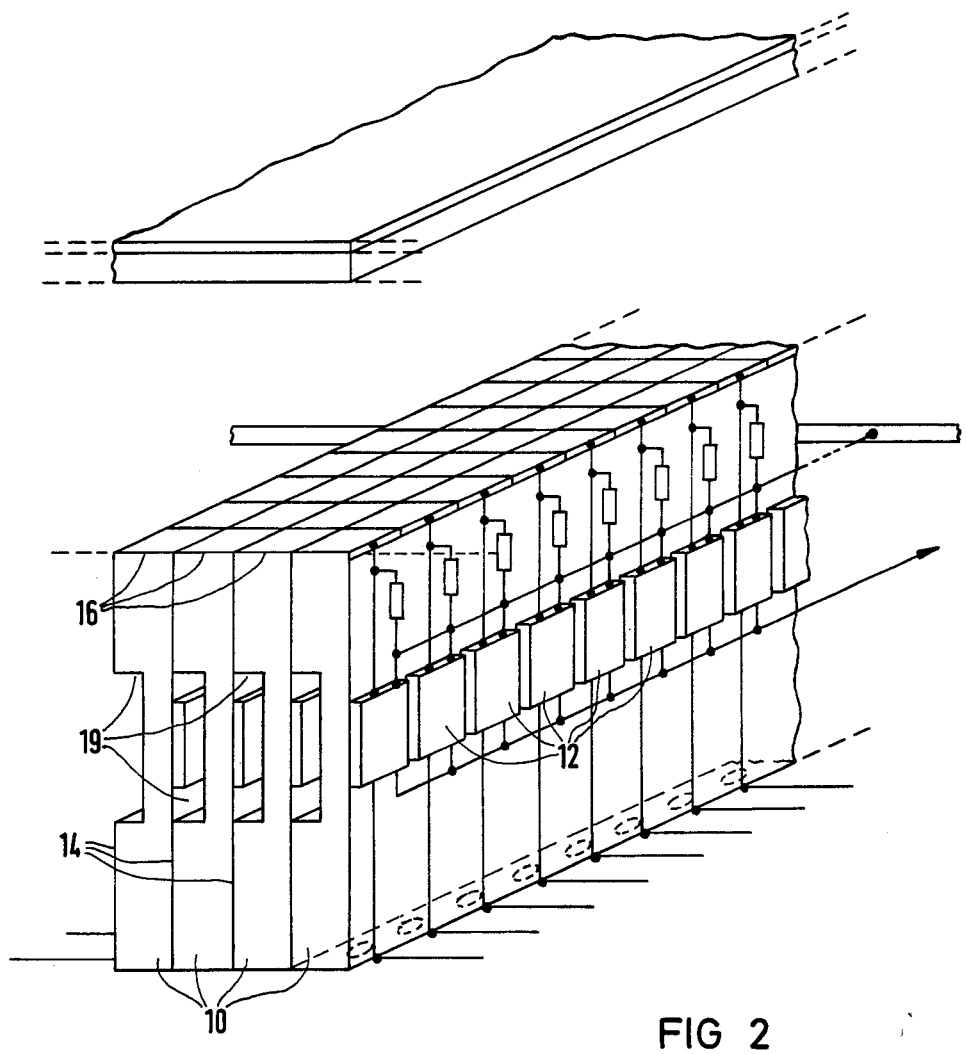
FIG. 2 is an isometric and schematic representation of a further embodiment of the invention.

FIG. 2 is an isometric and schematic representation of a particularly advantageous embodiment of the invention. In FIG. 2, one of the flat sides 14 of each circuit board 10 is provided with a slot 19 which extends parallel to the narrow sides 16 and covers the dual-gate MOS-FETs 12 of the adjacent circuit board 10.

Figure 3:
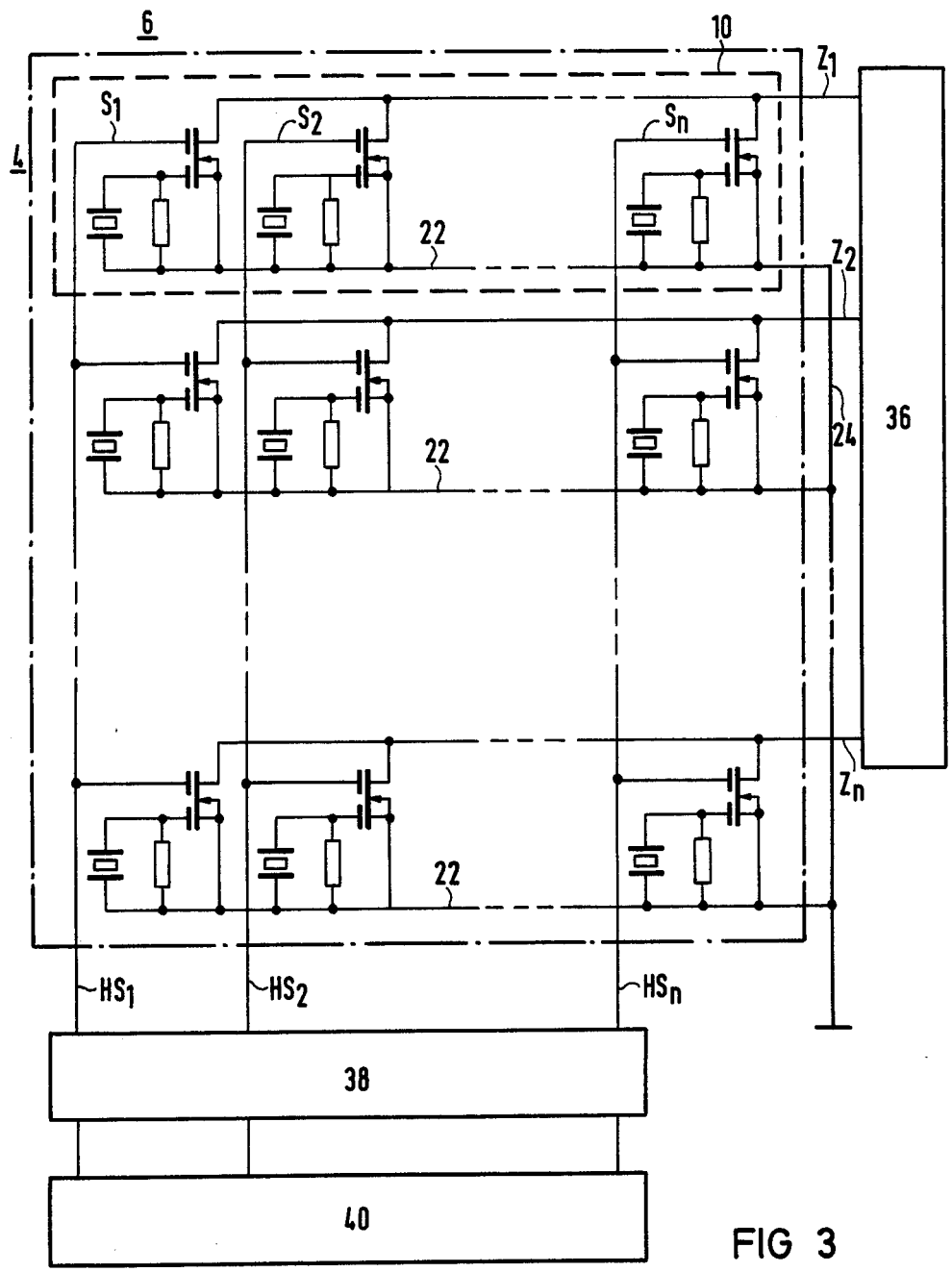
FIG. 3 is a schematic and function block representation of a circuit arrangement constructed in accordance with the principles of the invention.

FIG. 3 is a schematic and function block representation of an electric circuit of the present apparatus for reading-out two-dimensional charge images. The matrix consists of several, illustratively 200, rows 4, each of which corresponds to a circuit board 10. The signal output lines, of which only three are shown in FIG. 3, are designated $Z_1$, $Z_2$, and $Z_n$. The signal output lines are connected outside of circuit boards 10 to a multiplexer 36. Ground lines 22 are connected outside of circuit boards 10 to a ground bus 24. The control lines of the respective circuit boards 10, of which only some are shown in this figure, and are designated as $S_1$, $S_2$ . . . $S_n$, are connected electrically to each other in the direction of columns 6 by means of main control lines, of which only a few are shown and are designated as $HS_1$, $HS_2$, . . . $HS_n$. The main control lines are connected to a level converter 38 and their inputs are connected to a shift register 40. By this design of ground lines 22, ground bus 24, and the signal output lines, an adding of the currents within the matrix is prevented.

Although the invention has been disclosed in terms of specific embodiments and applications, persons skilled in the art, in light of this teaching, can generate additional embodiments without exceeding the scope or departing from the spirit of the claimed invention. Accordingly, it is to be understood that the drawings and descriptions in this disclosure are proffered to facilitate comprehension of the invention and should not be construed to limit the scope thereof.

What is claimed is:

1. A device for reading-out a two-dimensional charge image, the device comprising an array formed of a plurality of stacked circuit boards, each circuit board having two flat sides and two narrow sides, one of the flat sides being provided with a recess extending in a longitudinal direction parallel to said narrow sides of said circuit board, said recess comprising a housing for electronic components having control lines which are arranged on at least one of the flat sides of the circuit boards, one of the narrow sides of each circuit board being provided with a plurality of electrodes arranged in a row, said narrow sides being arranged adjacent each other such that the adjacently arranged electrodes form a matrix of electrodes arranged in rows and columns, the apparatus further comprising:

a plurality of switchable amplifiers arranged adjacent each other in the longitudinal direction of each recess, each amplifier having a control line;

a plurality of connecting conductors of approximately equal length coupling respective ones of the electrodes with corresponding ones of said switchable amplifiers; and a plurality of main control lines arranged on the narrow side of each circuit board opposite the electrodes in the direction of the columns of the matrix for connecting respective ones of the control lines of said switchable amplifiers disposed in the same column to one another.

2. The device of claim 1 wherein each of said switchable amplifiers associated with respective ones of the electrodes is arranged on the flat side of its associated circuit board, facing away from the recess.

3. The device of claim 1 wherein said switchable amplifiers are dual-gate MOS-FETs.

4. The device of claim 3 wherein the electrodes of each circuit board are connected respectively to a first gate of an associated dual-gate MOS-FET.

5. The device of claim 4 wherein a second gate of each dual-gate MOS-FET is connected to a respective control line.

6. The device of claim 3 wherein a drain terminal of each dual-gate MOS-FET of each circuit board is connected to a common signal line.

7. The device of claim 1 wherein the recess is configured as a slot.

8. The device of claim 1 there is further provided a ground bus arranged outside of the circuit boards for connecting a plurality of ground lines of the circuit boards to one another.

9. The device of claim 1 wherein the matrix of the electrodes is provided with a layer of an ultrasonic-sensitive material.

10. The device of claim 9 wherein said ultrasonic-sensitive layer is formed of a foil of polyvinylidene fluoride PVDF.

11. The device of claim 9 wherein said ultrasonic-sensitive layer is a polymer foil which contains a powder of lead-zirconate-titanate PZT.

12. The device of claim 1 wherein said matrix of electrodes is provided with a light-sensitive layer.

13. The device of claim 12 wherein said light-sensitive layer consists of silicon.

14. The device of claim 9 wherein said ultrasonic-sensitive layer is provided with an electrode thereover.

15. The device of claim 13 wherein an electrode is provided above said light-sensitive layer.

16. The device of claim 3 wherein there is further provided a plurality of leak resistors associated with respective ones of said dual-gate MOS-FETs and respectively arranged between a connecting conductor and a common ground conductor.

* * * * *